United States Patent [19]
Elmquist et al.

[11] Patent Number: 5,880,583
[45] Date of Patent: Mar. 9, 1999

[54] CRYOGENIC CURRENT COMPARATOR BASED ON LIQUID NITROGEN TEMPERATURE SUPERCONDUCTORS

[75] Inventors: Randolph E. Elmquist; Ronald F. Dziuba, both of Gaithersburg, Md.

[73] Assignee: The United States of America as represented by the Secretary of Commerce, Washington, D.C.

[21] Appl. No.: 774,372

[22] Filed: Dec. 27, 1996

[51] Int. Cl.$^6$ ................................................. G01R 33/035
[52] U.S. Cl. ............................................................ 324/117 R
[58] Field of Search ............................... 324/117 R, 248;
505/842, 843; 327/527, 528, 520, 521

[56] References Cited

U.S. PATENT DOCUMENTS 5,666,052   9/1997   Sata .......................................... 324/248

OTHER PUBLICATIONS

Harvey, I.K., A Precise Low Temperature dc Ratio Transformer; Review of Scientific Instruments; vol. 43, pp. 1626–1629 (1972) Oct. 1972.

Elmquist et al, "A High–Temperature Superconductor CCC", 1994 Conference on Precision Electromagnetic Measurements Digest, pp. 136–137, (Unavail Month).

Elmquist et al, "High–Temperature Superconductor CCC", IEEE, vol. 44, No. 2, pp. 262–264, Apr. 1995.

Heikki Seppa, "The Ratio Error of the Overlapped–Tube CCC", IEEE, vol. 39, No. 5 , pp. 689–697, Oct. 1990.

Peter Gutmann, "A Comparation of the CCC and the Josephson Potentiometer in Resistance Bridges Using Their Figures of Merit", IEEE, vol. 42, No. 2, pp. 385–390, Apr. 1993.

*Primary Examiner*—Vinh P. Nguyen
*Attorney, Agent, or Firm*—Larson & Taylor

[57] ABSTRACT

A cryogenic current comparator device is based on the magnetic shielding properties of superconducting tubes and maintains electrical currents being compared in a highly exact integer ratio. One pair of superconducting tubes are arranged adjacent to each other so that the longitudinal axis of each tube are parallel. A coil of current carrying wire is formed by winding the wire down through a longitudinal bore of the first tube and then back up the longitudinal bore of the second tube to form at least one turn or loop of the coil. A second, identical pair of superconducting tubes is placed adjacent and longitudinally parallel to the first pair of tubes so that a superconducting quantum interference device magnetometer is surrounded by the four tubes in order to measure a magnetic field induced by the current traveling through the coils. The device operates at a temperature of 77 degrees K. and is used to predict the relative uncertainty of a wide range of resistance and current ratio measurements to approximately one part in one hundred million.

13 Claims, 2 Drawing Sheets

CRYOGENIC CURRENT COMPARATOR BASED ON LIQUID NITROGEN TEMPERATURE SUPERCONDUCTORS

FIELD OF THE INVENTION

The present invention relates to current comparator devices, and, in particular, to a superconducting cryogenic current comparator device.

BACKGROUND OF THE INVENTION

Non-cryogenic current comparators are direct current comparator measurement devices which are not based on superconductive shielding. These devices are limited to a ratio uncertainty of about one part in ten million due to magnetic core noise. Moreover, windings of about one thousand turns are required to achieve this uncertainty.

I. K. Harvey is credited with development of the original cryogenic current comparator (CCC) device for operation at liquid helium temperature (see I. K. Harvey, "A Precise Cryogenic DC Ratio Transformer", Rev. Sci, Instrum., vol. 43, pp. 1626–1629 (1972)). This early comparator comprised a tube which provided Meissner-effect magnetic shielding between internal ratio windings and an external magnetic detector. Opposing currents in the ratio windings set up nearly canceling shielding currents on the surface of the tube, and a ratio balance at any integer ratio of currents could theoretically be detected and maintained using appropriate windings.

Present day CCC devices comprise liquid helium temperature overlapped tube-CCC devices which operate at 4.2° K. These devices have been used since about 1975 to measure resistance ratios in some laboratories which maintain and disseminate reference standards for electrical measurements. These CCC devices typically include several sets of windings shielded by continuous overlapping layers of a metal foil or shield which is superconducting at 4.2° K. The shielding can be nearly complete in overlapping tubes; however, the devices are complex and delicate, and as a consequence all such devices which are in use today are handmade.

SUMMARY OF THE INVENTION

In accordance with the invention, a superconducting cryogenic current comparator device is provided which is based on the magnetic properties of a number (at least two and preferably four) of superconducting tubes incorporating ratio windings for resistance ratio measurements. The device is capable of maintaining electrical currents in a highly exact integer ratio and these currents can be used to measure the ratio of two standard resistance references or to determine the value of one current by measuring a second current of larger or smaller value. The predicted relative uncertainty of a wide range of resistance and current ratios measured using the invention is approximately one part in one hundred million.

The device of the invention operates at a temperature of 77° K., preferably in a bath of liquid nitrogen. Meissner-effect shielding can be achieved at temperatures of 77° K. or above using certain superconducting materials. The device of the invention operates in a similar way as a cryogenic current comparator (CCC) device at 4.2° K.; however, the 77° K. CCC device of the invention uses a different shielding geometry described in more detail below, is produced using 77° K. superconducting magnetic shields, and preferably uses a 77° K. superconducting quantum interference device (SQUID) magnetometer. The higher operating temperature of the device of the invention reduces the cost of the coolant and cryogenic equipment needed to maintain the CCC device. Moreover, the shielding geometry used is of key importance in that the device can be manufactured and assembled in the required geometry using automated machinery, as opposed to the intensive manual handiwork which is required to produce shields with the complex geometry used for the 4.2° K. CCC device.

In accordance with a preferred embodiment of the invention, a cryogenic current comparator device, for maintaining an electrical current being compared in a highly exact integer ratio, comprises a first shield pair having first and second superconducting tubular shields each having a length and a longitudinal axis and defining a longitudinal bore, said first and second tubular shields being arranged with the longitudinal axes thereof in parallel; a coil comprising at least one current carrying wire extending through the bore of said first shield along the length thereof and back through the bore in the second shield along the length thereof to form a turn, said coil comprising a plurality of turns and said current carrying wire producing a magnetic field; and magnetic field detector means located outside of said shields in a region defined between said shields for detecting said magnetic field.

Preferably, said cryogenic current comparator device further comprises a second shield pair having first and second superconducting tubular shields each having a length and a longitudinal axis and defining a longitudinal bore, said first and second tubular shields of said second shield pair being arranged with the longitudinal axes thereof in parallel; a further coil comprising at least one further current carrying wire extending through the bore of said first shield of said second shield pair along the length thereof and back through the bore in the second shield of said second shield pair along the length thereof to form a turn, said further coil comprises a plurality of turns and said further current carrying wire producing a magnetic field; said first and second shield pairs being disposed in side by side relation with facing lateral surfaces of said first shields of said first and second shield pairs being adjacent, and facing lateral surfaces of said second shields of said first and second shield pairs being adjacent.

In a preferred implementation, the superconducting quantum interference device magnetometer is mounted in a cylindrical housing.

Advantageously, the quantum interference device has an axis of maximum magnetic field sensitivity perpendicular to said longitudinal axis of said shields cylinders and perpendicular to a plane parallel to said coils.

Preferably, the detection means is located approximately midway along the length of each longitudinally parallel shields and is surrounded by said shields.

In another preferred implementation, the shields have a maximum interior length dimension in cross-section and said shield lengths are at least twenty times said maximum interior length dimension in cross-section.

In an embodiment where the shields are circular in cross section, each of said shields has an equal interior diameter and the lengths of said shields are at least twenty times said interior diameter.

In a further embodiment, the shield pairs are disposed in side by side relation and facing lateral surfaces of said first shields of said shield pairs are connected together to form a first common exterior superconducting surface and facing lateral surfaces of said second shields of said shield pairs are connected together to form a second common exterior superconducting surface. The common exterior superconducting surface are preferably formed by fusing said first shields and said second shields together or by applying a common coating to said first shields and said second shields. Alternatively, the common exterior superconducting surface is formed from a piece of superconducting material affixed to each of said first shields and said second shields.

Advantageously, the first and second shields of each shield pair are separated by an electrically insulating film, so that no electrical current can flow between the first and second shields.

Advantageously, the cryogenic current comparator device is surrounded by a cylindrical superconducting magnetic shield for attenuating external magnetic fields.

Other features and advantages of the invention will be set forth, or apparent from, the following detailed description of the preferred embodiment of the invention.

BRIEF DESCRIPTION OF THE DRAWINGS

FIG. 2b is a perspective view of the embodiment of FIG. 2a;

DESCRIPTION OF THE PREFERRED EMBODIMENTS

Before referring directly to the drawings, some background considerations are believed to be helpful. The primary use of CCC devices is in an electrical circuit called a CCC bridge in which the CCC device and a superconducting quantum interference device (SQUID) magnetometer can be used to generate currents in a known current ratio. Currents in CCC windings can be maintained at a constant ratio equal to the inverse of the ratio of the number of turns in the windings. These currents can be used to measure the ratio of resistances or to determine the value of one current by measuring a second current of larger or smaller value.

The CCC bridge typically operates using an automatic feedback system. Two sources of direct or low-frequency alternating current generate rough currents $I_a$ and $I_b$ in approximately the desired integer ratio, which is $I_a/I_b=N_b/N_a$ where $N_a$ and $N_b$ are the number of turns in the two windings. These two currents are put through the two windings in opposition so that the resulting magnetic flux from the windings is partially canceled. The net magnetic flux is constrained to the inside of the superconducting shield due to the Meissner effect, and this flux sets up an electrical current on the superconducting shield surface which flows to the detection region of the CCC device. Using a SQUID as a magnetometer to detect the magnetic flux in the detection region, a feedback current is generated and is added to the current in one of the windings. Ideally this feedback is proportional to $N_aI_a-N_bI_b$ and has the correct sign and magnitude to produce the desired current ratio. The accuracy of this system depends on the magnetic shields separating the windings from the SQUID, which should act as ideal flux transformers that transfer the magnetic flux signal to the detection region. Like the 4.2° K. CCC device, the 77° K. device of the invention is to be used for low frequency electrical measurements only.

Meissner-effect shielding of magnetic flux at 77° K. is observed in certain high temperature superconductor (HTS) polycrystalline ceramic materials. Below the Josephson lower critical field, magnetic flux is excluded from the regions between the strongly superconducting grains so that these materials act like an ideal type-II superconductor. The surface currents produced by the excluded magnetic flux are persistent in such a weak magnetic field.

Figure 1:
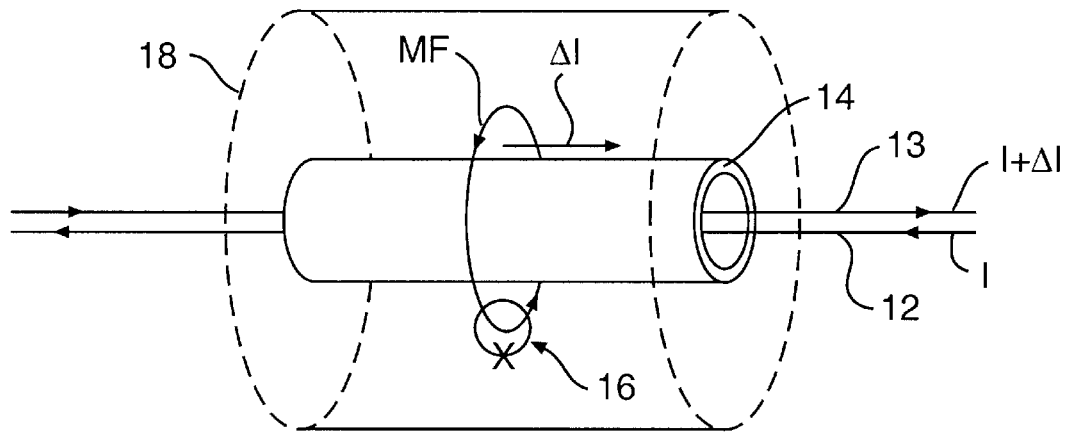
FIG. 1 is a perspective view of one component of the invention used in explaining the principles involved in CCC devices.

FIG. 1 is provided to facilitate a basic understanding of the dynamics of CCC devices. In FIG. 1, a pair of current carrying wires 12 and 13 are threaded through a cylinder or tube 14 of a superconducting material that sets up a persistent surface current. The surface current produced by wire 12 (or 13) has a magnitude equal to that of the current through the wire 12 (or 13) and flows on the inside of the tube 14 in the opposite direction to the current in the wire 12 (or 13). If there are two distinct wires carrying relatively small currents through the tube, as in FIG. 1, the magnitude of the total surface current will be the sum or difference of the individual surface currents, i.e., will be equal to $(I+\Delta I)-I=\Delta I$.

A corresponding exterior surface current $\Delta I$ returns on the exterior superconducting surface of tube 14 to complete the circuit of the current. This exterior current $\Delta I$ sets up a magnetic field MF. The magnetic field MF originating from the exterior surface current $\Delta I$ can be detected by a magnetometer indicated at 16. This detection is the basis of CCC operation. However, any magnetic field which does not originate from the surface current $\Delta I$ of tube 14 must be kept away from the magnetometer. This includes the field from the individual wires 12 and 13 and from sources external to the device. Therefore, a surrounding magnetic shield 18 is shown in FIG. 1 in surrounding relation to the superconducting tube 14 to provide shielding from such fields.

Figure 2A:
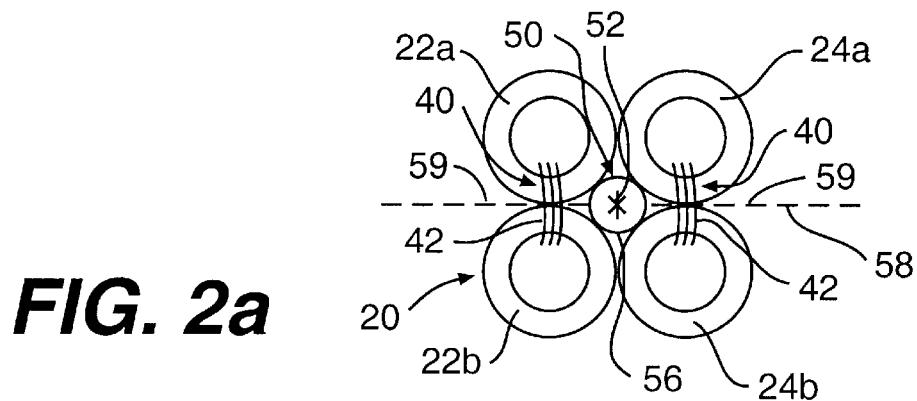
FIG. 2a is a front elevation view of a first embodiment of the invention showing the geometrical positioning of the superconductive tubes.
Figure 2B:
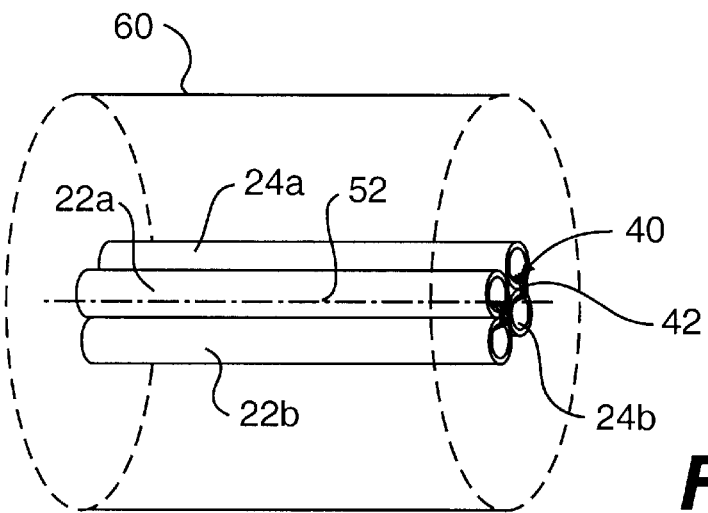

Referring to FIGS. 2a and 2b, there is shown a 77° K. CCC device constructed in accordance with a preferred embodiment of the invention. The device, which is generally denoted 20, comprises a set of two pairs of tube-like superconducting shields 22a, 22b and 24a, 24b, wherein each tube provides an unbroken, unpenetrated layer of superconducting material which supports a persistent current at 77° K. Suitable materials for the shields include bulk ceramic HTS materials and thick-film ceramic HTS coatings applied to a substrate material. Experiments have shown that the length of these shield tubes should be at least 20 times the interior diameter (or largest interior length dimension in cross-section) of the tubes 22a, 22b and 24a, 24b. Further, the shield wall thickness should be minimized to reduce the overall size of the device 20. Windings 40 are wound between the pairs of tubes such that, referring to tubes 22a and 22b as typical, the windings are formed in "turns" or loops having portions which extend along the tubes and expose portions, indicated at 42, which extend between the tubes. Since it is necessary that a minimum length of each winding 40 should be unshielded to minimize unwanted magnetic fields, the lowest possible number of shields made of straight sections is two.

Each CCC winding 40 is made up of a length of insulated, conducting wire. One pass of wire through one set of shield tubes, i.e, 22a, 22b or 24a, 24b, is equivalent to one turn or loop. The assembled set of shields must be fitted with one or more turns that pass through the set of superconducting shields to create each complete winding. The ratio of turns of the windings 40 located in the adjacent sets of shield tubes 22a, 22b and 24a, 24b determines the current ratios and resistance ratios which can be measured when using the CCC device 20.

A detection region 50 is located centrally of the four tubes 22a, 22b and 24a, 24b. The detection region 50 of the assembled CCC device 20 is designed to provide good coupling between the magnetic field generated by the exterior surface current and a SQUID magnetometer 52. As is indicated schematically in FIG. 2b, SQUID magnetometer 52 is located at the midpoint of the region 50 between the four tubes 22a, 22b and 24a, 24b. The detection region of the SQUID magnetometer 52 has a planar geometry and the SQUID magnetometer 52 is mounted in a cylindrical housing 56 so that the axis of maximum magnetometer field sensitivity is perpendicular to the longitudinal axis of the shield tubes 22a, 22b, 24a and 24b, and in the plane, indicated at 58, separating the two CCC shields of each set. As shown in FIG. 2a, electrically insulating shields 59 are placed in plane 58. The alignment of the SQUID magnetometer 52 described above maximizes the sensitivity thereof to the magnetic field originating from the exterior surface current.

In a preferred embodiment of the 77° K. CCC device 20, tubes are used which provide good global mechanical stability for the windings 40 and SQUID magnetometer 52. The portions of the tubes defining detection region 50 form a structure which allows the SQUID magnetometer 52 to be mounted securely therein. A surrounding magnetic shield 60 corresponding to shield 18 of FIG. 1 is also provided.

Figure 3A:
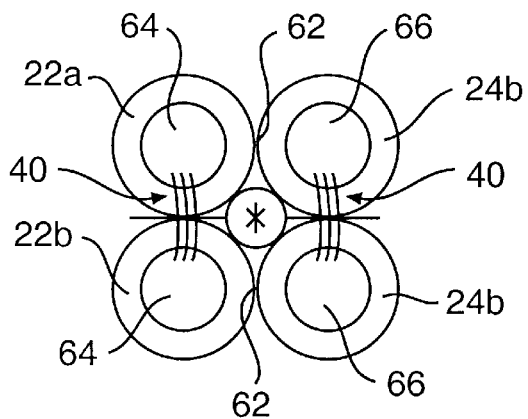
FIG. 3a is an end view of a modified embodiment of FIG. 2a showing fused tubes.
Figure 3B:
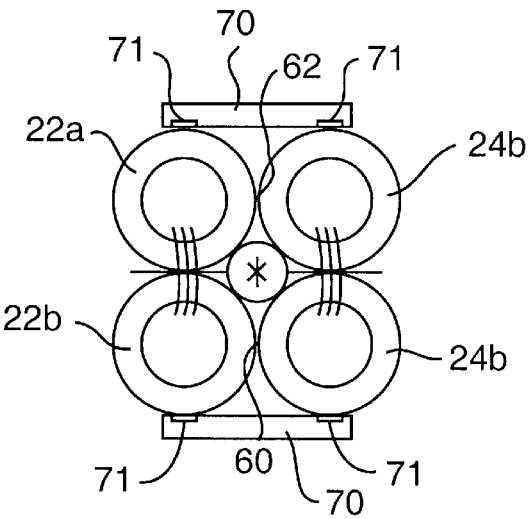
FIG. 3b is an end view of a modified embodiment of FIG. 3a showing rectangular plates fused to the superconductive tubes.

Two alternative embodiments of the superconducting shield sets of the invention are shown in FIGS. 3a and 3b. Referring to FIG. 3a wherein reference numerals corresponding to those of FIGS. 2a and 2b are used, the sets are constructed by joining two pairs of superconducting tubes 22a, 22b and 24a, 24b, either by fusing the tubes or by applying a common coating between tubes 22a and 24a, and between tubes 22b and 24b, at common joints 62 to create a common exterior superconducting surface which can support a persistent current at 77° K. These types of 77° K. CCC devices require two such fused or joined pairs which form two shields each having interior regions, denoted 64 and 66 respectively in each shield. Separate windings 40 occupy each interior region 64, 66 respectively, and the two interior regions 64, 66 both share a common exterior surface formed by joint 62 on which the detected exterior surface current flows. This continuous superconducting surface should extend a substantial distance, (advantageously, a distance approximately at least three times the interior diameter) into the tubes so as to increase the attenuation of the magnetic flux which originates inside the tubes.

The embodiment of FIG. 3b is similar to the embodiment of FIG. 3a but includes the addition of rectangular shields 70 which bridge tubes 22a, 24a and 22b, 24b. Shields 70 are fused or joined as described above at joints 71 and serve to further increase attenuation of the magnetic flux. The superconducting flux joints 71 and shields 70 form a continuous barrier to magnetic fields for the entire length of the tubular shields 22a, 22b, and 24a, 24b.

Figure 4:
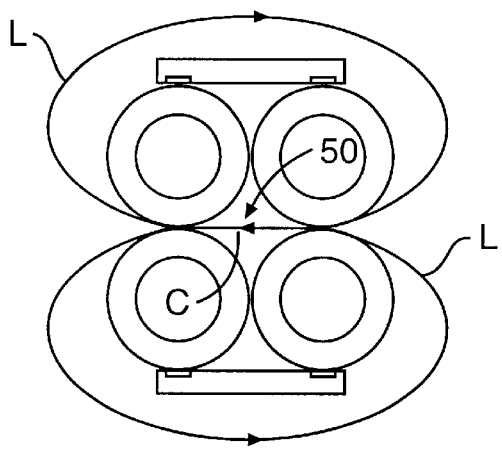
FIG. 4 is an end view of the embodiment of FIG. 3b depicting the magnetic field lines generated in the invention.

Referring to FIG. 4, which is a simplified version of FIG. 3b with components omitted for purposes of clarity, field lines, indicated at L and generated by the exterior surface current, must encircle the joined pairs of tubes shown in FIG. 4, rather than encircling individual tubes as predominantly occurs in the embodiment shown in FIGS. 2a and 2b. The joined tube design of FIGS. 3a and 3b allows high efficiency in detecting the magnetic field signal because the lines of the magnetic field in the detection region are concentrated away from the surfaces of the shield as shown. This embodiment employs the tendency of magnetic field lines to follow a path of minimum length, consistent with other physical and energetic constraints. The field lines L are predicted to be nearly parallel in the center C of the detection region 50, thus reducing the field gradients and microphonic noise in the magnetometer measurements.

Figure 5:
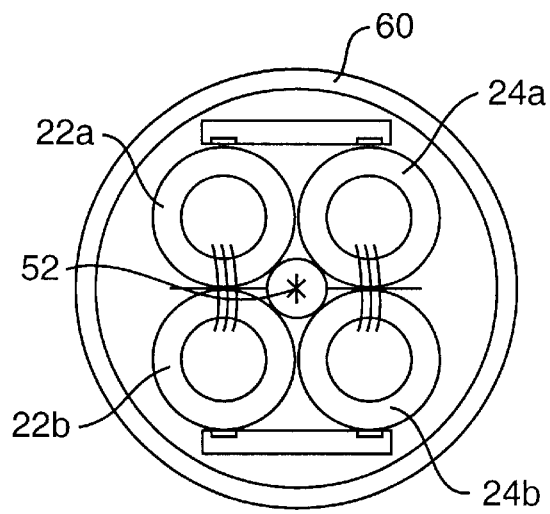
FIG. 5 is an end view of a modified embodiment of FIG. 3b showing a surrounding cylindrical shield.

As described above, the SQUID magnetometer 52 is placed in detection region 50 equidistant from the ends of the shield tubes. As shown in FIG. 5, and also mentioned above, an additional large cylindrical 77° K. superconducting magnetic shield 60, with an interior diameter sufficient to contain the assembled shields, is required for attenuation of external magnetic fields that do not originate from the surface current from the region occupied by the SQUID magnetometer 52. Shield 60 surrounds the shield tubes 22a, 22b, and 24a, 24b and is preferably of about the same length as the shield tubes. Using this 77° K. CCC device of FIG. 5, the estimated resistance values between one ohm and ten kiloohms could be compared at a relative uncertainty of about one in one hundred million. The device of the invention has been used to measure several one thousand ohm resistance references against one hundred ohm resistance references to a relative uncertainty of approximately one part in one hundred million. These measurements were made with windings of forty turns and four turns, which is over ten times fewer than would be required in a direct current comparator measurement with the same uncertainty.

Although the present invention has been described to specific exemplary embodiments thereof, it will be understood by those skilled in the art that the variations and modifications can be effected in these exemplary embodiments without departing from the scope and spirit of the invention.

What is claimed is:

1. A cryogenic current comparator device for maintaining an electrical current being compared in a highly exact integer ratio, said device comprising:

a first shield pair comprising first and second superconducting tubular shields each having a length and a longitudinal axis and defining a longitudinal bore, said first and second tubular shields being arranged with the longitudinal axes thereof in parallel;

a first coil comprising at least one current carrying wire extending through the bore of said first shield along the length thereof and back through the bore in the second shield along the length thereof to form a turn, said first coil comprising a plurality of turns and producing a magnetic field;

a second shield Pair comprising first and second superconducting tubular shields each having a length and a longitudinal axis and defining a longitudinal bore, said first and second tubular shields of said second shield pair being arranged with the longitudinal axes thereof in parallel and in parallel with the longitudinal axes of said first and second tubular shields of said shield pair;

a second coil comprising at least one further current carrying wire extending through the bore of said first shield of said second shield pair along the length thereof and back through the bore in the second shield of said second shield pair along the length thereof to form a further turn, said second coil comprising a plurality of further turns and producing a further magnetic field; and magnetic field detector means located outside of said shields in a region defined between said shields of said first and second shield pairs for detecting said magnetic field;

said first and second shield pairs being disposed in side by side relation, facing lateral surfaces of said first shields of said first and second shield pairs being Joined together to form a first common exterior superconducting surface, and facing lateral surfaces of said second shields of said first and second shield pairs being Joined together to form a second common exterior superconducting surface.

2. A cryogenic current comparator device as claimed in claim 1 further comprising cooling means for maintaining said device at a temperature of a least approximately 77 degrees Kelvin.

3. A cryogenic current comparator device as in claim 2 wherein said quantum interference device magnetometer has an axis of maximum magnetic field sensitivity perpendicular to said longitudinal axis of said shields and in a plane separating said first and second shields of each of said shield pairs.

4. A cryogenic current comparator device as in claim 1 wherein said detector means comprises a superconducting quantum interference device magnetometer.

5. A cryogenic current comparator device as in claim 1 wherein said detection means is located approximately midway along the length of said shield pairs and is surrounded by said shields.

6. A cryogenic current comparator device as in claim 2 wherein said cooling means comprises a liquid nitrogen bath at approximately 77 degrees Kelvin.

7. A cryogenic current comparator device as in claim 1 wherein said shields have a maximum interior length dimension in cross-section and said shield lengths are at least twenty times said maximum interior length dimension in cross-section.

8. A cryogenic current comparator device as in claim 1 wherein each of said shields are circular in cross section and have an equal interior diameter, and the lengths of said shields-are at least twenty times said interior diameter.

9. A cryogenic current comparator device as in claim 1 further comprising a cylindrical housing in which said detecting means is mounted.

10. A cryogenic current comparator device as in claim 1 wherein each said common exterior superconducting surface is formed by fusing said first shields and said second shields together.

11. A cryogenic current comparator device as in claim 1 wherein each said common exterior superconducting surface comprises a common coating applied to said first shields and to said second shields.

12. A cryogenic current comparator device as in claim 1, further comprising first and second superconducting members affixed to each of said first shields and to each of said second shields, respectively.

13. A cryogenic current comparator device as in claim 1 wherein said device is surrounded by a cylindrical superconducting magnetic shield for attenuating external magnetic fields.

\* \* \* \* \*